(12) United States Patent
Miyakawa et al.

(10) Patent No.: US 6,708,401 B2
(45) Date of Patent: Mar. 23, 2004

(54) METHOD OF MANUFACTURING ARTICLE HAVING ELECTRONIC CIRCUIT

(75) Inventors: Hidenori Miyakawa, Moriguchi (JP); Yoshio Maruyama, Kyoto (JP); Hiroshi Yamauchi, Katano (JP); Mikiya Nakata, Suita (JP); Takashi Akiguchi, Osaka (JP); Yoshinori Wada, Suita (JP); Kazuhiro Mori, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 145 days.

(21) Appl. No.: 09/818,899

(22) Filed: Mar. 28, 2001

(65) Prior Publication Data

US 2002/0036898 A1 Mar. 28, 2002

(30) Foreign Application Priority Data

Mar. 29, 2000  (JP) ........................................ 2000-090509

(51) Int. Cl.[7] ................................................ H05K 3/30
(52) U.S. Cl. .............................. 29/832; 29/833; 29/840
(58) Field of Search .......................... 29/825, 832, 833, 29/840; 174/DIG. 8

(56) References Cited

U.S. PATENT DOCUMENTS

| | | | | |
|---|---|---|---|---|
| 3,909,504 A | * | 9/1975 | Browne | |
| 4,496,406 A | * | 1/1985 | Dedow | |
| 4,695,926 A | * | 9/1987 | McDermott | |
| 5,274,914 A | * | 1/1994 | Kitamura et al. | |
| 5,407,865 A | * | 4/1995 | Glovatsky et al. | |

FOREIGN PATENT DOCUMENTS

| | | | |
|---|---|---|---|
| JP | 01-095045 | * | 4/1989 |
| JP | 06-216524 | * | 8/1994 |
| JP | 8-18275 | | 1/1996 |

* cited by examiner

*Primary Examiner*—Carl J. Arbes
(74) *Attorney, Agent, or Firm*—Wenderoth, Lind & Ponack L.L.P.

(57) ABSTRACT

A package is formed by covering a circuit board with a thermoplastice film. The cylindrical or sheet-like thermoplastic film is decompressed and used to cover the circuit board to protect the board and components mounted on the board.

11 Claims, 10 Drawing Sheets

METHOD OF MANUFACTURING ARTICLE HAVING ELECTRONIC CIRCUIT

BACKGROUND OF THE INVENTION

The present invention relates to a method of manufacturing an article with an electronic circuit which is composed of a circuit unit, such as a circuit board with electronic components mounted thereon, covered with a cylindrical or a sheet-like film. The invention also relates to an article with an electronic circuit manufactured by the method of manufacturing the same.

In recent years, as a method of forming circuit boards, there has been known a reflow process using a solder paste or a conductive adhesive as a bonding agent.

However, the solder paste contains zinc, which is not desirable in terms of conservation of the global environment.

The conductive adhesive contains a large amount of metallic powder filled into resin, which causes poor bond strength and low impact resistance compared to a metallic solder. To improve impact resistance, there is a separately-conducted method in which components are sealed on a board using a sealant. This method, however, brings about difficulty in later board repair, including replacement of components, and causes difficulty in recovery and recycle of the components. In addition, there are other issues, such as hardening of sealing resin that takes a long time.

In the case where the board is sealed with silicon resin or urethane resin for the purpose of protecting the board from moisture or dust, there arises difficulty, like in the above case, in later board repair including replacement of components, as well as difficulty in recovery and recycle of the components. In addition, there are other issues, such as hardening of sealing resin that takes a long time.

Japanese Laid-Open Patent Publication No. 8-18275 proposes a technology as a solution for these issues. According to this publication, a board is inserted into a rectangle bag which has a conductive layer and a thermal weld layer and whose three sides are closed. After the board is inserted through the remaining one open side of the bag, the open side is closed through heat shielding and thermal deposition for achieving electromagnetic shielding of the board.

With the above-disclosed structure, three sides of a film "bag" are closed in advance before the board is inserted therein, which limits the size of a board to be inserted into the bag. Accordingly, use of different sized boards requires steps of preparing different sized bags and selecting an appropriate sized bag corresponding to a board in use, making the technology complex and less general.

In order to solve the above-stated issues, the object of the present invention is to provide an article with an electronic circuit, as well as to provide a method of manufacturing the same. Each of the methods is capable of corresponding to different sized boards and is rich in generality, allows packaging for a short period of time, provides an increase in impact resistance, and facilitates recovery and recycle of components, boards, and the like.

SUMMARY OF THE INVENTION

In order to accomplish the above object, the present invention has the following embodiments.

According to a first aspect of the present invention, there is provided an electronic circuit-formed article manufacturing method characterized by manufacturing an article with an electronic circuit. A circuit board having electronic components is inserted into a cylindrical film so that the board is covered with the cylindrical film. Thereafter, both opening portions of the cylindrical film are sealed to package the circuit board.

According to a second aspect of the present invention, there is provided an electronic circuit-formed article manufacturing method including covering an area, which has electronic components on an article with an electronic circuit formed having the electronic components, with sheet-like films.

According to a third aspect of the present invention, there is provided an electronic circuit-formed article manufacturing method including covering both front and back surfaces of a circuit board having electronic components with two sheet-like films, and packaging the circuit board with the sheet-like films.

According to a fourth aspect of the present invention, there is provided a method of manufacturing an article with an electronic circuit as defined in the third aspect, wherein the front surface of the circuit board is covered with one of the two sheet-like films. The back surface of the circuit board is then covered with the other sheet-like film to package the circuit board.

According to a fifth aspect of the present invention, there is provided a method of manufacturing an article with an electronic circuit as defined in the third aspect, wherein the circuit board is packaged by simultaneously covering both the front and the back surfaces of the circuit board with the two sheet-like films.

According to a sixth aspect of the present invention, there is provided a method of manufacturing an article with an electronic circuit as defined in any one of the first to fifth aspects, wherein the film is heated in advance to be softened, and then the board is covered.

According to a seventh aspect of the present invention, there is provided a method of manufacturing an article with an electronic circuit as defined in any one of the first to sixth aspects, wherein the thickness of the film is 10 to 200 $\mu$m.

According to an eighth aspect of the present invention, there is provided a method of manufacturing an article with an electronic circuit as defined in any one of the first to seventh aspects, wherein during the process of covering the board with the film, decompression is conducted between the film and the board so as to make the film follow the components or the board.

According to a ninth aspect of the present invention, there is provided a method of manufacturing an article with an electronic circuit as defined in any one of the first to eighth aspects, wherein the film is composed of a heat-shrinkable material. The film is heated and heat-shrunken so as to make the film follow the board and the components.

According to a 10th aspect of the present invention, there is provided a method of manufacturing an article with an electronic circuit as defined in any one of the first to ninth aspects, wherein the film is composed of a visible material.

According to an 11th aspect of the present invention, there is provided a method of manufacturing an article with an electronic circuit as defined in any one of the first to 10th aspects, wherein during covering of the board with the film, decompression is conducted between the film and the board through use of a hole of the component so as to make the film follow the components or the board. A valve provided in the hole then prevents gas from entering between the film and the board from outside through the air hole.

According to a 12th aspect of the present invention, there is provided a method of manufacturing an article with an electronic circuit as defined in any one of the first to 11th aspects, wherein an elastic sheet is provided between the film and the components or the board.

According to a 13th aspect of the present invention, there is provided a method of manufacturing an article with an electronic circuit as defined in any one of the first to 12th aspects, wherein an adhesion layer is provided in an internal surface of the film for adhering the film to the electronic components or the board.

According to a 14th aspect of the present invention, there is provided a method of manufacturing an article with an electronic circuit as defined in any one of the first to 13th aspects, wherein the film allows gas generated from flame retarders or solder flux used in the board and the components as well as moisture generated from the board made of paper phenol to pass from inside to outside but to prevent moisture and dust from invading the inside of the film from the outside.

According to a 15th aspect of the present invention, there is provided a method of manufacturing an article with an electronic circuit as defined in any one of the first to 14th aspects, wherein an absorbent material such as desiccants and activated carbon is provided inside the film for absorbing gas generated from flame retarders or solder flux used in the board and the components as well as moisture generated from the board made of paper phenol.

According to a 16th aspect of the present invention, there is provided a method of manufacturing an article with an electronic circuit as defined in any one of the first to 15th aspects, wherein the board is heated in advance to a temperature equal to or higher than a temperature at which the film is softened, and to a temperature lower than a temperature at which the film is melted, and to a temperature in a range so that a bonding agent to bond the board and the components is not melted. Then, the board is packaged with the film, so that the film is softened upon contact with the heated board, making the film follow the board.

According to a 17th aspect of the present invention, there is provided a method of manufacturing an article with an electronic circuit as defined in any one of the first to eighth aspects and 10th to 16th aspects, wherein the film is composed of a thermoplastic material. When the board is covered with the film, decompression is executed between the film and the board so as to make the film follow the components or the board, while at the same time, the film is heated and attached to each other to achieve sealing.

According to an 18th aspect of the present invention, there is provided a method of manufacturing an article with an electronic circuit including inserting a circuit board having electronic components into a cylindrical film. Both opening portions of the cylindrical film are then sealed, and the cylindrical film is cut to package the circuit board.

According to a 19th aspect of the present invention, there is provided a method of manufacturing an article with an electronic circuit, including printing or applying an electronic component mounting bonding agent on electrodes of a circuit board, and bringing electronic components close to above positions through mechanical application of pressure. The components are then fixed on the board through heating, and the board is packaged with cylindrical film or sheet-like films.

According to a 20th aspect of the present invention, there is provided a method of manufacturing an article with an electronic circuit as defined in the 19th aspect, wherein the electronic component mounting bonding agent is a metallic solder or a thermosetting conductive adhesive.

According to a 21st aspect of the present invention, there is provided an article with an electronic circuit, manufactured by the method of manufacturing an article with an electronic circuit formed as defined in any one of the first to 20th aspects.

BRIEF DESCRIPTION OF THE DRAWINGS

These and other aspects and features of the present invention will become clear from the following description of the preferred embodiments with reference to the accompanying drawings, in which.

DETAILED DESCRIPTION OF THE INVENTION

Figure 1:
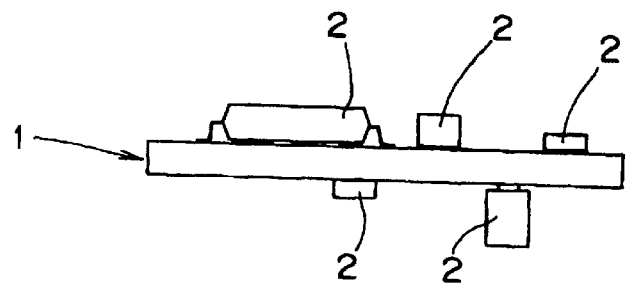
FIG. 1 is a side view showing a mount board with components mounted thereon to which a method of manufacturing an article with an electronic circuit according to a first embodiment of the present invention is applied.

Before the description of the present invention proceeds, it is to be noted that like parts are designated by like reference numerals throughout the accompanying drawings. Embodiments of the present invention will be described hereinafter with reference to accompanying drawings.

Figure 2:
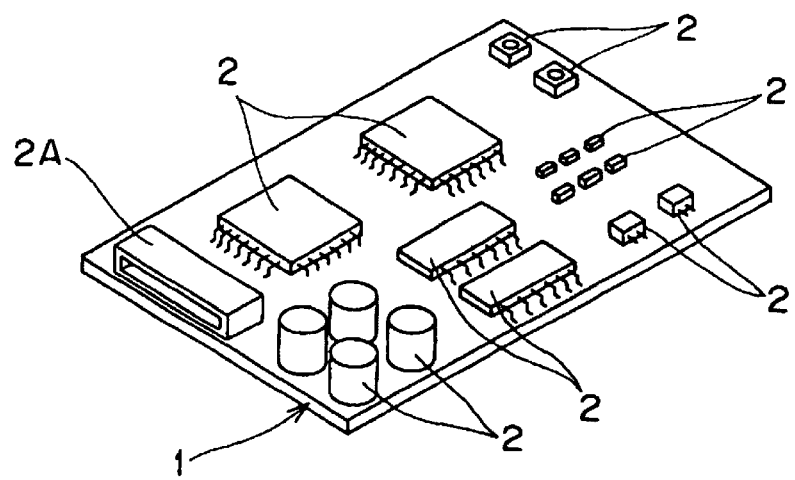
FIG. 2 is a perspective view showing a mount board with components mounted thereon to which the method of manufacturing an article with an electronic circuit according to the first embodiment of the present invention is applied.
Figure 3:
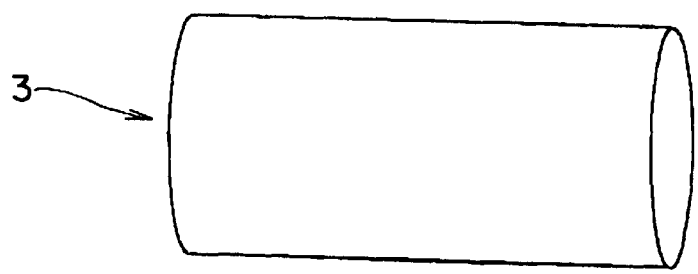
FIG. 3 is a perspective view showing a cylindrical film for use in the method of manufacturing an article with an electronic circuit according to the first embodiment of the present invention.

A method of manufacturing an article with an electronic circuit according to a first embodiment of the present invention includes a step of printing or applying an electronic component mounting bonding agent on electrodes of a circuit board 1 shown in FIGS. 1 and 2, a step of bringing electronic components 2, . . . , 2 close to the positions of the above electrodes through mechanical application of pressure, and a step of fixing the components 2 on the board 1 through heating, so that a components-mounted circuit board 1 as shown in FIG. 2 is manufactured through the above steps. The method further includes a step of, thereafter, packaging most of the components-mounted circuit board 1 obtained by mounting the components 2, . . . , 2 on the circuit board 1 with a cylindrical film 3 shown in FIG. 3 for completing an article with an electronic circuit 80 shown in FIG. 4B. It is noted that the article with an electronic circuit 80 means a product which has a board 1 with the electronic components provided thereon or a circuit-formed unit with a circuit formed thereon and the electronic components, such as casings of electrical appliances, electronic devices, arranged thereon, covered with a film.

In the printing or applying step, the electronic component mounting bonding agent, such as metallic solders or thermosetting conductive adhesives, is printed or applied on each electrode of the circuit board 1.

In the step of bringing the electronic components 2, . . . , 2 close to the positions of the electrodes, each electronic component 2 vacuum-picked up and held by a pickup head (unshown) or the like is mechanically brought close to the corresponding electrodes on the circuit board 1 with the electrodes located at positions where the electronic components 2 are to be mounted using the pickup head, and pressure is applied for attaching the components.

In the fixing step, the above-stated solder is melted through heating. Then, the electrodes of the electronic components 2, . . . , 2 placed on the circuit board 1 as shown above are bound to the electrodes on the board 1 with the solder so as to fix the placed electronic components 2, . . . , 2 on the board 1. It is noted that reference numeral 2A in FIG. 2 represents a connector among the electronic components 2.

Figure 4A:
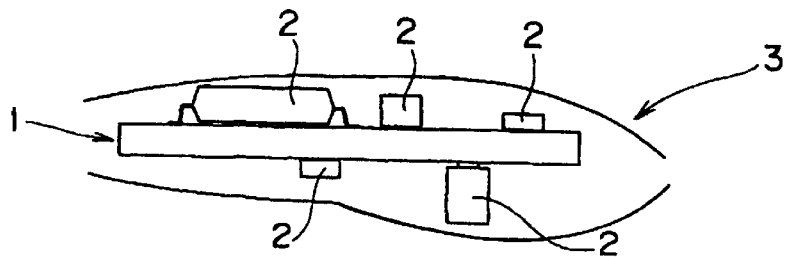
FIGS. 4A and 4B are side views each showing an article with an electronic circuit before and after being formed by the method of manufacturing an article with an electronic circuit according to the first embodiment of the present invention.
Figure 4B:
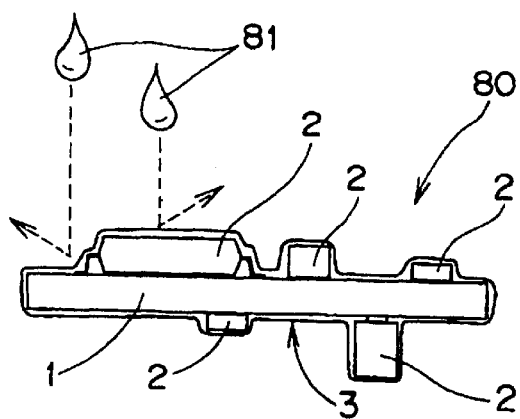

In the packaging step, most of (approximately all of) both the front and back surfaces of the board 1 with the electronic components 2, . . . , 2 mounted thereon is inserted into the cylindrical film 3 (see FIG. 4A) so that most of both the front and back surfaces of the board 1 is covered and packaged with the film 3 (see FIG. 4B). It is noted that the cylindrical film refers to a film in a state such that two confronting sides of two rectangular sheet-like films are closed or integrated for continuity.

The cylindrical film 3 for packaging, if having a thickness of less than 10 μm, is poor in impact resistance and therefore not desirable. If the film 3 has a thickness larger than 200 μm, the ability to follow (conform to) the external shape of the electronic components is deteriorated, which generates large inner space, and therefore results in no sealing effect. Consequently, the film 3 having a thickness of 10 to 200 μm achieves excellent impact resistance and a sufficient sealing effect.

In the case where the cylindrical film 3 is composed of a thermoplastic material, the board 1 is inserted into the film 3 (see FIG. 4A), and then the inside of the film 3 is decompressed while the film 3 is heated. As a result, the heated and softened film 3 is more likely to follow the surface of the board 1 and components 2, ..., 2 on the board (i.e., conform to the contour), which decreases gases remained between the film 3 and the surface of the board 1 and the components 2, ..., 2 on the board. This ensures a proper decompressing and tight closing operation to maintain the decompressed condition.

When the board 1 is inserted into the film 3 for packaging the board 1 therewith, if the internal pressure of the film 3 is set to be 200 Torr or less, adhesiveness of the film 3 to the electronic components 2, ..., 2 is improved, which results in reinforcement of fixing strength of the electronic components 2, ..., 2 to the board 1. As a result, excellent impact resistance is obtained.

In the case where the cylindrical film 3 is composed of a heat-shrinkable material, the board 1 is inserted into the cylindrical film 3 from either one of the opening portions of the cylindrical film 3 (see FIG. 4A). Thereafter, the film 3 is heated to cause heat shrinkage, which brings the film 3 into close contact with the circuit board 1 and the components 2, ..., 2 thereon, enabling the board 1 to be packaged (see FIG. 4B).

It is noted that one kind of cylindrical film 3 with a length large enough to correspond to the boards 1 with various target sizes for packaging may be prepared and cut out to be a desired length depending on the size of a board 1 to be packaged before packaging is performed. It is also possible that after the board 1 is inserted into the cylindrical film 3, both of the openings of the cylindrical film 3 are blocked and unnecessary portions thereof are cut off for packaging the circuit board 1.

As stated above, according to the article with an electronic circuit and the method of manufacturing the same in the first embodiment, the following functions and effects can be implemented.

For packaging boards with components mounted thereon by inserting them into a bag, if various-sized products are packaged, different-sized bags are prepared in advance and it is necessary to select an appropriately sized bag according to the size of each board and component. Contrary to this, the first embodiment of the present invention makes it possible to cover an article with a circuit (e.g. the board 1) with the cylindrical film 3, which enables use of the same cylindrical film 3 for performing the packaging operation even though various products having different sizes are packaged. As a result, the generality is achieved and the packaging operation is simplified and facilitated. In particular, in the case where a rectangular cylindrical film 3 is used to package a rectangular board 1, the board 1 is inserted into the cylindrical film 3 so that a lengthwise direction of the board 1 may match with a lengthwise direction of the rectangular cylindrical film 3 since rectangular boards 1 normally tend to vary in size in their lengthwise direction. Accordingly, the cylindrical film 3 becomes capable of corresponding to different-sized boards 1 only by changing the sealing position of the cylindrical film 3 in the lengthwise direction.

Conventionally, in order to reinforce the bond strength of conductive adhesives, there has been a separately-conducted method to seal components on a board using a sealant, in which the sealant is applied so as to cover the board and the components thereon. However, sealing the components on the board with the sealant brings about difficulty in later board repair including replacement of components, as well as in recovery and recycle thereof. In addition, this method requires 4 hours or more to harden sealing resin as the sealant, which increases the time necessary for the sealing operation. On the contrary, if the board 1 with the electronic components 2, ..., 2 mounted thereon is packaged with the cylindrical film 3 based on the method of manufacturing an article with an electronic circuit according to the first embodiment, the cylindrical film 3 protects the electronic components 2, ..., 2 and reinforces the bond strength. As a result, impact resistance is improved, and a simple operation of unsealing the cylindrical film 3 easily enables repair of the board 1 and the components 2, as well as recovery and recycle of the components 2. In addition, time taken for packaging the board 1 becomes, for example, 1 minute or less. Also, repackaging after repair of the components 2 can be easily implemented.

In the method of sealing a board with silicon resin or urethane resin or the like for the purpose of protecting the board from moisture, dust, salt damage, and the like, there arises difficulty, like the above case, in later board repair including replacement of components, as well as in recovery and recycle of the components. In addition, this method requires about 8 hours to harden the sealing resin, which increases the time necessary for the sealing operation. Contrary to this, if the board 1 is packaged with the cylindrical film 3 as in the first embodiment, the board 1 can easily obtain moisture resistance, dust resistance, and salt damage resistance with reliability. Further, a simple operation of easily unsealing the cylindrical film 3 allows for various operations including repair of the board 1 and the components 2, which have been difficult to perform with the conventional sealing method, and therefore allows various conventional issues to be solved. It is noted that reference numeral 81 in FIG. 4B represents a drop of water.

Next, description will be given of an article with an electronic circuit and a method of manufacturing the same according to a second embodiment of the present invention. The second embodiment is different from the first embodiment in that a film 3 is heated before it is used to package a board 1, and two sheet-like films 3A and 3B are substituted for the film 3.

Figure 5:
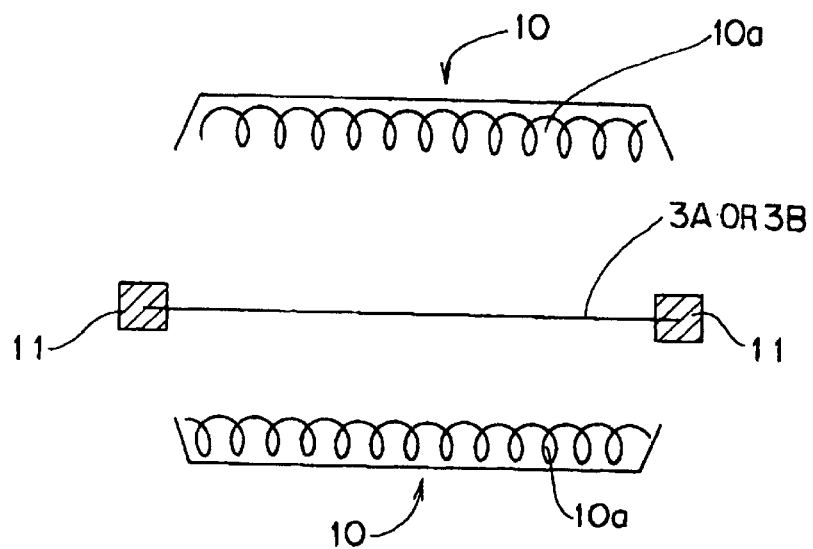
FIG. 5 is an explanatory view explaining the state of softening a film in a method of manufacturing an article with an electronic circuit according to a second embodiment of the present invention.

More particularly, before the board 1 is packaged with the films 3A and 3B, at least each two confronting sides of the rectangle films 3A and 3B are held by a pair of rodlike film-holding portions 11, 11 as shown in FIG. 5. In this state, the films 3A and 3B are heated in upward and downward directions with electrically heated wires 10a, 10a of heating apparatuses 10, 10 so as to be softened. After the films 3A and 3B are softened, the board 1 and the components 2, ..., 2 on the board 1 are each packaged with the films 3A and 3B so as to be covered therewith. Consequently, the films 3A and 3B conform to the contour of the board 1 and the components 2, ..., 2 on the board 1 in an improved manner, which decreases space between the board 1 and the components 2, ..., 2 on the board 1 and the films 3A and 3B. As a result, efficient packaging can be performed in a short period of time. It is noted that the edges of the films 3A and 3B are fixed to each other through use of adhesives or through welding to achieve a sealed condition or an approximately sealed condition.

In the process of heating and softening the films 3A and 3B, at least each two confronting sides of the films 3A and 3B are held by a pair of rodlike film-holding portions 11, 11. However, for stabilizing the posture of the films 3A and 3B during the process of film softening, it is preferable that each of the four sides of the films 3A and 3B are held. A means of softening the films 3A and 3B is not limited to the use of the heating wires 10a, 10a of the heating apparatuses 10, 10, and therefore heating through hot wind is also applicable. The films 3A and 3B may be heated in either upward or downward direction, though heating in both the upward and downward directions implements uniform softening of the films 3A and 3B in a short period of time.

It is noted that one kind of sheet-like film 3A and 3B with dimensions large enough to correspond to all the sizes of packaging-target boards 1 may be prepared and cut out to desired dimensions depending on the size of a board 1 to be packaged, before packaging is performed. It is also possible that after the board 1 is inserted between the sheet-like films 3A and 3B, four sides of the sheet-like films 3A and 3B are tightly closed, and unnecessary portions of the sheet-like films 3A and 3B are cut out for packaging the circuit board 1.

According to the above-described second embodiment, the following functions and effects can be implemented. For packaging boards with components mounted thereon by inserting them into a bag, if various products in which the size of boards and the components varies are packaged, different-sized bags should be prepared in advance and an appropriately-sized bag is selected according to the size of each board and component. On the contrary, the second embodiment of the present invention makes it possible to cover an article with a circuit formed (e.g. the board 1) with the sheet-like films 3A and 31B, enabling use of the same sheet-like films 3A and 3B for performing the packaging operation even though various products in which the size of the board 1 and the components varies are packaged. As a result, generality is achieved and the packaging operation is simplified and facilitated. In particular, in the case where rectangular boards 1 vary in size not only in their lengthwise direction but also in their shorter side direction orthogonal to the lengthwise direction, a rectangular board 1 is covered with one rectangular sheet-like film 3A or 3B and then the sheet-like film 3A or 3B is fixed to the board. Alternatively, both front and back surfaces of a rectangular board 1 are covered with two rectangular sheet-like films 3A and 3B and then the sheet-like films 3A and 3B are fixed to each other. Accordingly, a simple operation of changing the fixing position of the sheet-like films 3A and 3B makes it possible to accommodate different sized boards 1.

In addition, packaging the board 1 with sheet-like films 3A and 3B enables easy and reliable achievement of moisture resistance, dust resistance, and salt damage resistance of the board 1. Further, a simple operation of unsealing the sheet-like films 3A and 3B easily allows various operations including repair of the board 1 and the components 2, which have been difficult to perform with the conventional sealing method, and therefore enables various conventional issues to be solved.

Next, description will be given of an article with an electronic circuit and a method of manufacturing the same according to a third embodiment of the present invention. The third embodiment is different from the first and second embodiments in that the front and back surfaces of a board 1 are each vacuum-molded in sequence with two sheet-like films 3A and 3B and brought into close contact therewith. The third embodiment will be described with reference to FIG. 6.

Figure 6:
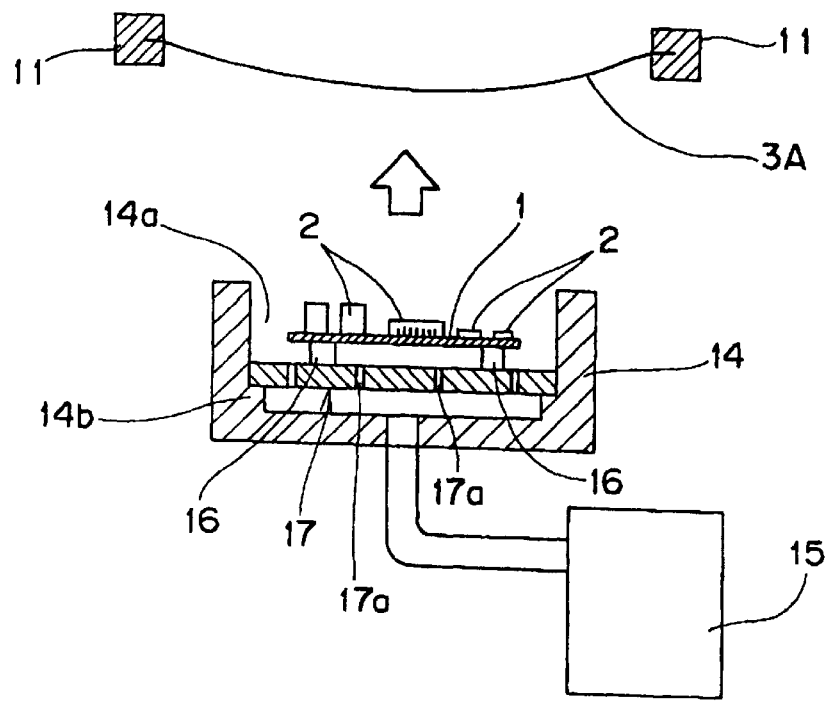
FIG. 6 is an explanatory view showing a schematic configuration of a vacuum forming unit for use in a method of manufacturing an article with an electronic circuit according to a third embodiment of the present invention.

FIG. 6 shows a suction box 14 with the shape of a rectangle box, and whose central bottom is connected to a vacuum pump 15. On a rectangular frame-like supporting projection 14b inside a deposition space 14a in the suction box 14, there is fixed a deposition board 17, on which a board 1 is placed through a plurality of rodlike spacers 16, . . . , 16. A number of penetrating holes 17a, . . . , 17a are formed on the deposition board 17.

At least two confronting sides of a film 3A covering the front surface side of the board 1 are held by one pair of rodlike film holding portions 11, 11. In the heated and softened condition, the film 3A is placed on an upper opening of the suction box 14 with the board 1 set therein. At this point, care is taken so as to prevent generation of space between the film 3A and the suction box 14 as much as possible.

Figure 7:
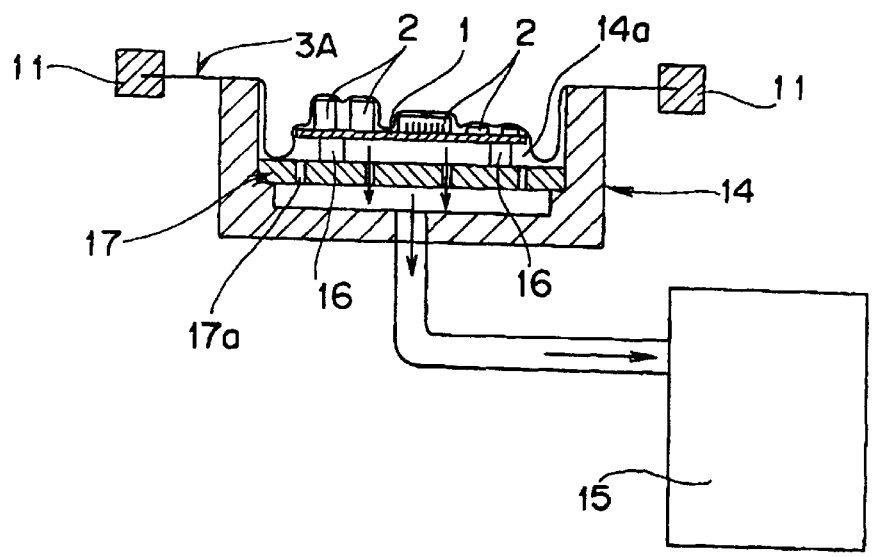
FIG. 7 is an explanatory view showing the state of conducting vacuum forming with the use of the vacuum forming unit of FIG. 6.

Next, the vacuum pump 15 is driven to execute suction from the bottom portion of the deposition space 14a in the suction box 14 through use of the vacuum pump 15. More particularly, a gas (e.g. air) in the deposition space 14a with the board 1 set therein is sucked to the side of the vacuum pump 15 through the penetrating holes 17a, . . . , 17a of the deposition board 17. Due to the suction box 14 in contact with the film 3A, the deposition space 14a with the board 1 set therein is sealed. Further, continuous driving of the vacuum pump 15 to suck the air in the deposition space 14a deforms the softened film 3A and draws it into the deposition space 14a. As a result, as shown in FIG. 7, the film 3A comes into close contact with the surface of the board 1 such that it follows (conforms to) the surface of the board 1. The board 1 is floated from the deposition board 17 with the presence of the spacers 16, . . . , 16, so that the film 3A can be bent from edges of the board 1 into the back surface, i.e. the lower surface side of the board 1.

Figure 8:
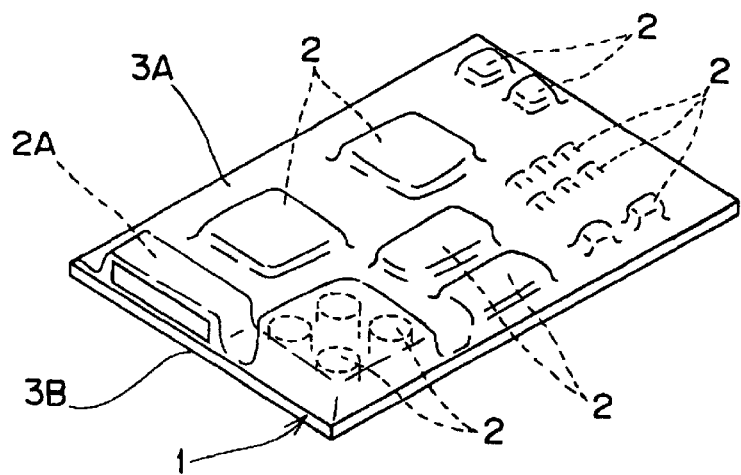
FIG. 8 is a perspective view showing an article with an electronic circuit formed obtained through vacuum packaging of a mount board with components mounted thereon in the method of manufacturing an article with an electronic circuit according to the third embodiment of the present invention.
Figure 9A:
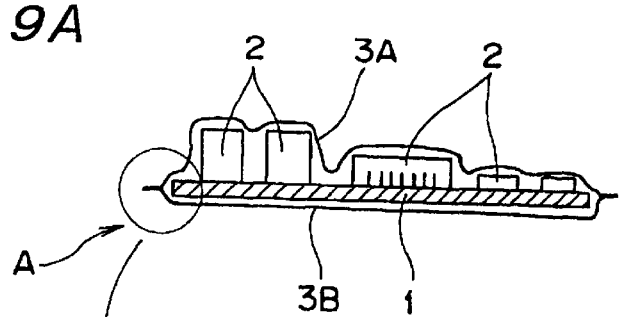
FIGS. 9A and 9B are, respectively, a cross sectional view showing an article with an electronic circuit obtained through vacuum packaging of a mount board with components mounted thereon, and a partially enlarged cross sectional view showing a part of FIG. 9A indicated with an arrow A, in the method of manufacturing an article with an electronic circuit formed according to the third embodiment of the present invention.
Figure 9B:
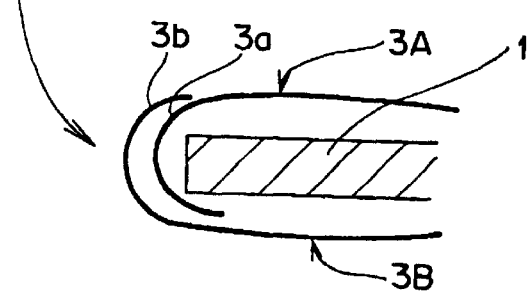

After that, the board 1 is placed upside down so that the back surface of the board 1 having been positioned to face the lower side of suction box 14 is changed to be the front side. Then, the board 1 is placed on the deposition board 17 inside the deposition space 14a through the spacers 16, . . . , 16. Then, another film 3B is vacuum-molded on the back surface of the board 1 based on the same process as used to cover the front surface side of the board with the film 3A. As a result, the softened film 3B is deformed and drawn into the deposition space 14a of the suction box 14. Consequently, as shown in FIG. 7, the film 3B comes into close contact with the back surface of the board 1 such that it follows the back surface of the board 1. This enables tight sealing of both the front and back surfaces of the board 1 with two films 3A and 3B. FIG. 8 shows the board 1 of FIG. 2 packaged with the films 3A and 3B. FIG. 9A is a cross sectional view showing the thus-packaged board 1. As enlarged in FIG. 9B, in the edges of the board 1, an edge portion 3b of the upper film 3B is laid on top of an edge portion 3a of the upper side of the film 3A. These edges are fixed to each other through molding and the like, by which the sealed condition is maintained.

According to the third embodiment, two films may vary in thickness and materials. For example, a thick film is disposed on one side of a board having a lead head of an insertion component for inserting a lead into a penetrating hole of the board to obtain electrical connection. A thin film is disposed on the other side of the board having a heat generating component or a reflow component. This implements further improvement of the functions.

Figure 10:
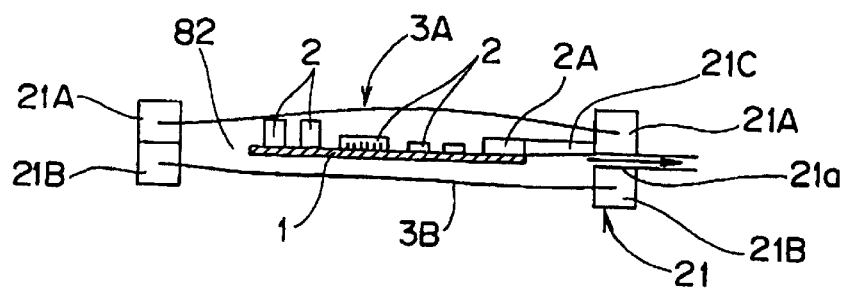
FIG. 10 is an explanatory view showing the state of packaging a mount board with components mounted thereon with a film disposed on and under the mount board in a method of manufacturing an article with an electronic circuit according to a fourth embodiment of the present invention.
Figure 11:
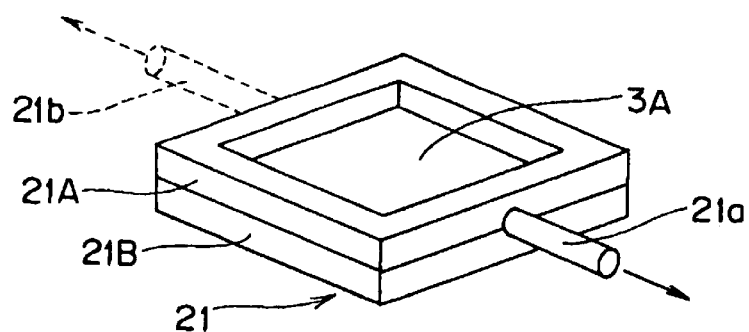
FIG. 11 is a schematic perspective view showing a device for use in the method of manufacturing an article with an electronic circuit according to the fourth embodiment of the present invention.

Next, description will be given of an article with an electronic circuit and a method of manufacturing the same according to a fourth embodiment of the present invention. The fourth embodiment is different from the third embodiment in that, as shown in FIG. 10, two films 3A and 3B are placed so as to confront the front and the back surfaces of a board 1 in upward and downward directions, enabling simultaneous tight closing and packaging of the front and the back surfaces of the board 1. In this case, at least two confronting sides of the film 3A are held by a pair of rodlike film holding portions 21A, 21A (preferably four sides thereof are held by two pairs of the film holding portions), while at least two confronting sides of the film 3B are held by a pair of rodlike film holding portions 21B, 21B (preferably four sides thereof are held by two pairs of the film holding portions). Next, with the board 1 interposed between the film 3A held by the film holding portions 21A, 21A and the film 3B held by the film holding portions 21B, 21B, each film holding portion 21A and each film holding portion 21B are brought in close contact with each other without causing leakage of air therebetween. As a result, a space 82 which is surrounded by the film 3A, the film holding portions 21A, 21A, the film 3B, and the film holding portions 21B, 21B, and which is accommodating the board 1 becomes an enclosed space. Through use of a suction pipe 21a or 21b interposed between either or both of the film holding portions 21A and 21B, air in the space 82 is vacuum-sucked by a vacuum pump. On the film holding portion 21A or 21B, there is mounted a board supporting portion 21C projecting toward the board 1. The board supporting portion 21C is connected to the film holding portions 21A and 21B through the use of a connector 2A of the board 1 or the like to support the board 1. The board supporting portion 21C supports the board 1 in the middle of the space 82 through the connector 2A.

According to the fourth embodiment, both the front and the back sides of the board 1 can be tightly closed with two sheet-like films 3A and 3B with one suction process, resulting in increased productivity.

Figure 12:
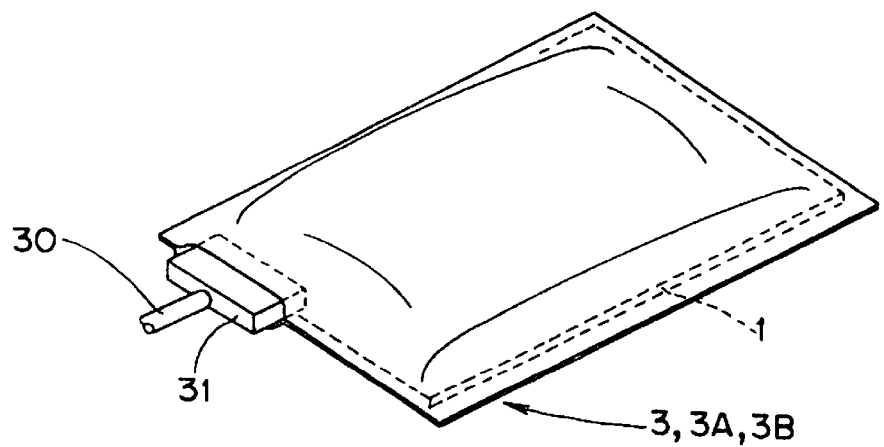
FIG. 12 is an explanatory view showing the state of vacuum sucking from a connector of a mount board with components mounted thereon in a method of manufacturing an article with an electronic circuit according to a fifth embodiment of the present invention.
Figure 13:
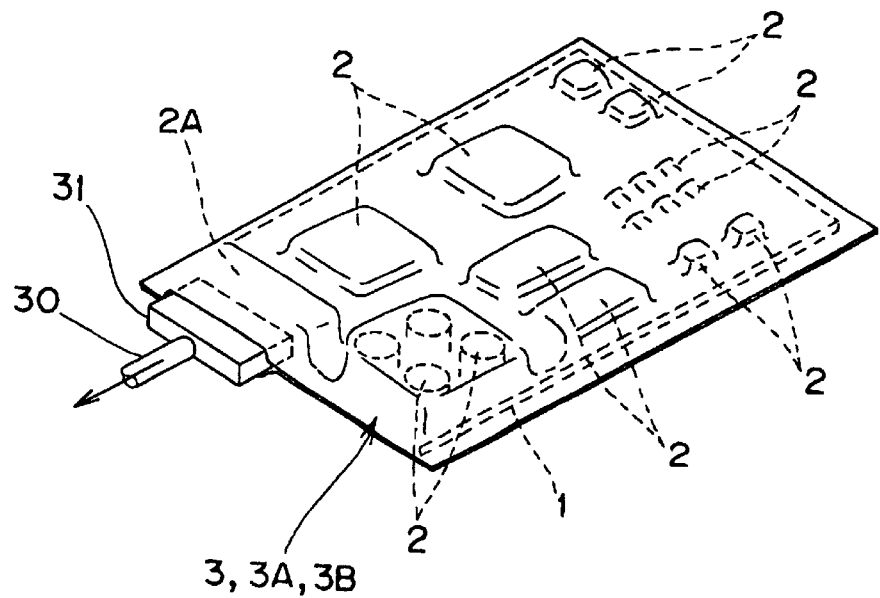
FIG. 13 is an explanatory view showing a state in which vacuum-sucking has been performed from the connector of the mount board with the components mounted thereon in the method of manufacturing an article with an electronic circuit formed according to the fifth embodiment.

Description will be now given of an article with an electronic circuit formed and a method of manufacturing the same according to a fifth embodiment of the present invention with reference to FIGS. 12 and 13. The fifth embodiment is different from the previous embodiment in that, as shown in FIG. 13, suction is executed through the use of a connector 2A mounted on the board 1.

Figure 16:
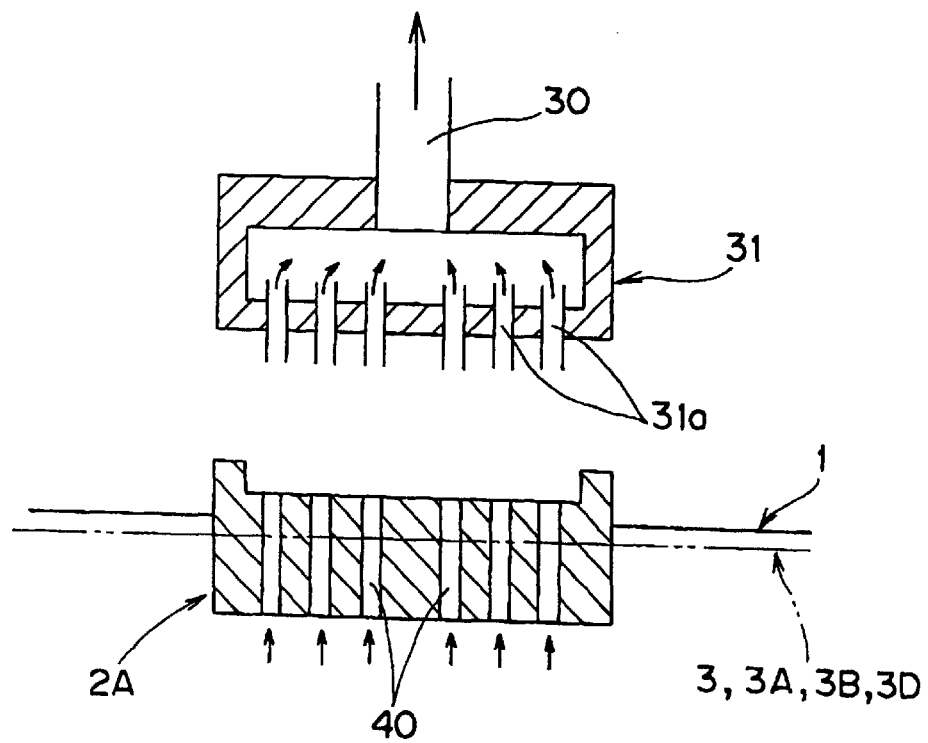
FIG. 16 is a cross sectional view showing the connector and the vacuum sucking connector for use in the method of manufacturing an article with an electronic circuit according to the fifth embodiment of the present invention.

The connector 2A mounted on the board 1 normally has air pathways. After a vacuum-sucking connector 31 is attached to the connector 2A of the board 1, the board 1 is inserted into a cylindrical film 3 or in between sheet-like films 3A and 3B. Then, the cylindrical film 3 or the sheet-like films 3A and 3B surrounding the board 1 are tightly closed, and air is sucked from the vacuum-sucking connector 31 through a suction pipe 30 by a vacuum pump or the like. Thus, packaging is performed as shown in FIG. 13. The vacuum-sucking connector 31 is equipped with at least one, and preferably a number of, suction pipes 31a, . . . , 31a to perform suction smoothly as shown in FIG. 16.

It is noted that the connector 2A may be equipped with at least one and preferably a number of suction holes 40, . . . , 40 corresponding to the vacuum-sucking connector 31 to perform smoother suction.

Although the board 1 is tightly closed only with a cylindrical film 3 or sheet-like films 3A and 3B in FIG. 12, tight closing may be performed by pressing the film using a block and the like.

According to the above-stated fifth embodiment, when the degree of inner vacuum is decreased by secular change and the like, the degree of vacuum can be restored through suction with use of suction pipes 31a, . . . , 31a, without cutting the film.

Figure 14:
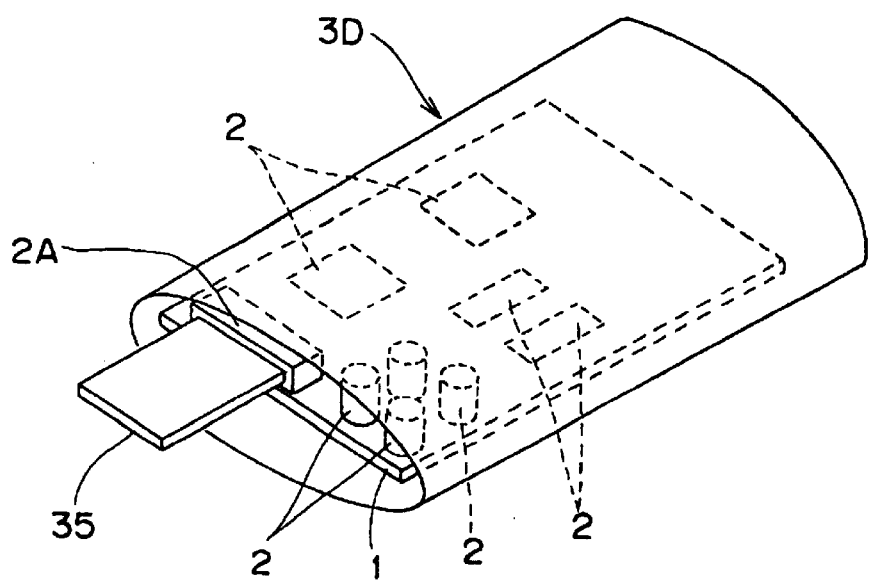
FIG. 14 is an explanatory view showing a state of packaging a mount board with components mounted thereon with the use of a spacer for a connector in a method of manufacturing an article with an electronic circuit according to a sixth embodiment of the present invention.

Description will be now given of an article with an electronic circuit and a method of manufacturing the same according to a sixth embodiment of the present invention. The sixth embodiment is different from the previous embodiment in that, as shown in FIG. 14, a cylindrical or sheet-like heat-shrinkable film 3D is used.

Figure 15:
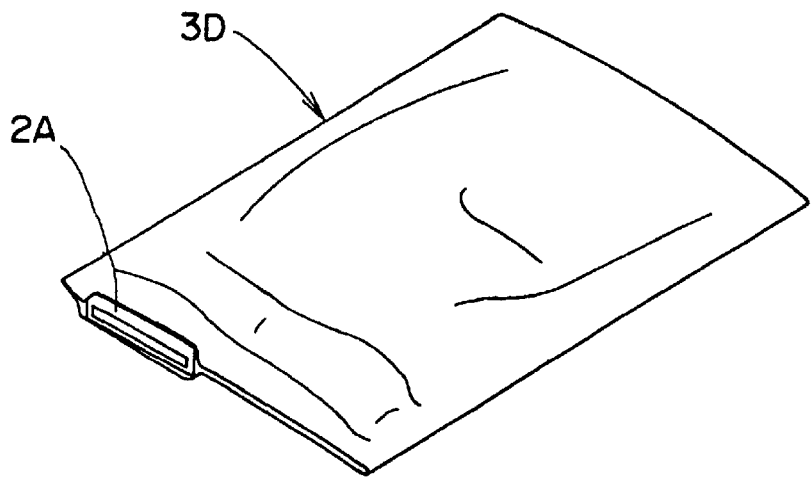
FIG. 15 is an explanatory view showing the state of a mount board with components mounted thereon after being vacuum-sucked from a connector thereof in the method of manufacturing an article with an electronic circuit according to the sixth embodiment of the present invention.

It is difficult to predict the shape of a heat-shrinkable film 3D after its shrinkage. Therefore, it is necessary in the connector 2A on the board to secure space for inserting a connector for use in supplying power or sending signals to the board 1 through the connector 2A. Consequently, a spacer 35 dedicated to a connector is inserted to the connector 2A of the board 1. Then, the film 3D is heated so that the film 3D is heat-shrunken and conforms to the board 1. After that, an unnecessary portion of the film 3D is cut off and the spacer 35 dedicated to the connector is removed, by which the board 1 can be packaged while the space for inserting the connector is secured as shown in FIG. 15.

According to the above-stated sixth embodiment, even with the use of a heat-shrinkable film 3D, the spacer 35 dedicated to a connector is inserted in the connector 2A of the board 1. Therefore, when the film 3D is heat-shrunken and follows the board 1, improvident insertion of the film 3D into the connector 2A is prevented, and therefore the board 1 can be packaged while the space for the connector insertion is secured.

Description will be now given of an article with an electronic circuit and a method of manufacturing the same according to a seventh embodiment of the present invention. The seventh embodiment is different from the previous embodiment in that, as shown in FIGS. 17A to 17D, a valve 44 is mounted on the suction hole 40 in the side of the board or the film to maintain the degree of vacuum inside a package.

Figure 17A:
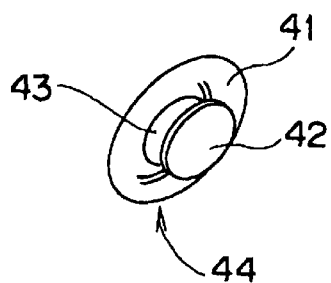
FIGS. 17A, 17B, 17C, and 17D are, respectively, a perspective view of a valve in the process of being coupled with a connector of a mount board with components mounted thereon, an explanatory view of the valve in an opened state, an explanatory view of the valve in a closed state, and a perspective view of a valve in a modified embodiment, each in a method of manufacturing an article with an electronic circuit formed according to a seventh embodiment of the present invention.
Figure 17B:
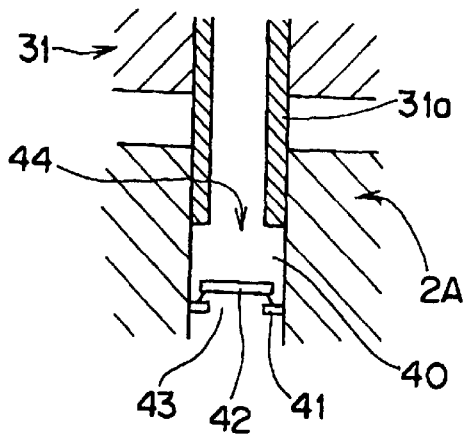
Figure 17C:
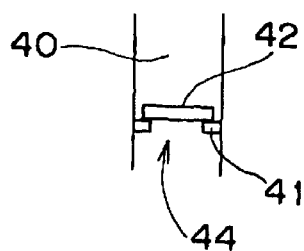
Figure 17D:
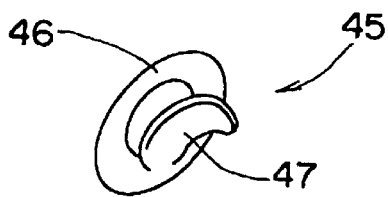

FIG. 17A shows the valve 44. The valve 44 fixed to the suction hole 40 is composed of an elastic material such as rubber. The valve 44 creates an open state (see FIG. 17B) in which a round central portion 42 is elevated from a circular peripheral portion 41 surrounding the central portion 42, by which a hole 43 and space are generated between the central portion 42 and the circular portion 41. A closed state (see FIG. 17C) can also be created, in which the round central portion 42 is in close contact with the circular peripheral portion 41 surrounding the central portion 42 so that no space is generated between the central portion 42 and the circular portion 41.

Accordingly, in the suction hole 40, execution of vacuum suction elevates the round central portion 42 from the circular peripheral portion 41 surrounding the central portion 42, by which the hole 43 and the space are generated between the central portion 42 and the circular portion 41. This creates the open state (see FIG. 17B), which allows suction of air from the side of the board. On the other hand, upon termination of the sucking operation, the round central portion 42 comes in close contact with the circular peripheral portion 41 surrounding the central portion 42 by atmospheric pressure so that no space is generated between the central portion 42 and the circular portion 41. This creates the closed state (see FIG. 17C), preventing air from entering inside of the film from outside.

Execution of vacuum suction may be implemented with the valve 44 which creates the open state (see FIG. 17B) in which the round central portion 42 is elevated from the circular peripheral portion 41 surrounding the central portion 42, by which the space is generated between the central portion 42 and the circular portion 41. The vacuum suction may also be generated with a valve 45 shown in FIG. 17D, in which an incision is formed in an elastic round member, which elevates a part of a round central portion 47 from a circular portion 46 surrounding the central portion 47 while making it inclined, and thereby generates space between the central portion 47 and the circular portion 46.

According to the above-stated seventh embodiment, the valve 44 is provided in the suction hole 40 in the side of the board or the film, which prevents air from entering inside a package, and maintains the degree of vacuum in the package for a long period of time. Further, if the degree of vacuum in the package is decreased due to internal gas generation and the like, the degree of vacuum can be restored through re-suction without replacement of the film.

Next, a description will be given of an article with an electronic circuit and a method of manufacturing the same according to an eighth embodiment of the present invention. The eighth embodiment is different from the previous embodiment in that, as shown in FIGS. 18A and 18B, a vacuum-sucking connector 31 is inserted into a connector 2A of the board 1, so that a suction pipe 31a of the vacuum-sucking connector 31 is inserted into a suction hole 40 of the connector 2A for forced opening of a valve 50 in the suction hole 40.

Figure 18A:
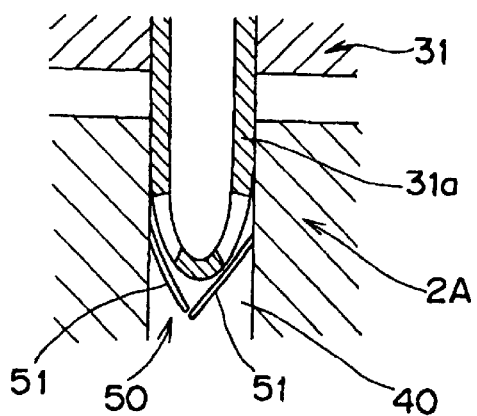
FIGS. 18A and 18B are, respectively, an explanatory view showing a valve in an open state with a suction tube inserted into a connector of a mount board with component mounted thereon, and an explanatory view showing a valve in a closed state with the aspirating tube extracted from the connector, in a method of manufacturing an article with an electronic circuit according to an eighth embodiment of the present invention.
Figure 18B:
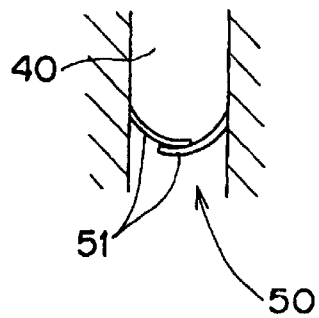

As shown in FIG. 18A, the valve 50 is composed of a plurality of elastic pieces 51, 51. Normally, the elastic pieces 51, 51 are overlaid on each other by elasticity thereof to allow tight closing. When the top portion of the suction pipe 31a separates the plurality of the elastic pieces 51, 51, a space is generated between the elastic pieces 51 and 51, which makes the valve 50 open. In this state, a sucking operation can be executed through the suction pipe 31a. Upon extraction of the top portion of the suction pipe 31a, the elastic pieces 51, 51 are overlaid on each other by elasticity thereof so that tight closing is achieved.

According to the above-stated eighth embodiment, the valve 50 is provided in the suction hole 40 in the side of the board or the film, which prevents air from entering inside a package maintains the degree of vacuum in the package for a long period of time. Further, if the degree of vacuum in the package is decreased due to internal gas generation and the like, the degree of vacuum can be restored through re-suction without replacement of the film.

In the above-described first to eighth embodiments, materials usable as film 3, 3A, 3B, and 3D, include prestretched polyethylene terephthalate (PET) (thermal deformation type) where water absorptivity (waterproof property) is 0.3%, water-vapor permeability (dampproofness) is 28 g/m$^2$/24 hr., an oxygen transmission rate (oxide resistance) is 3 cc/m2 /hr./atm, and heat conductivity (heat dissipation) is 6.7×10$^{-4}$ cal/sec.cm ° C. Another usable material may be drawn polystyrene where water absorptivity (waterproof property) is 0.05%, water-vapor permeability (dampproofness) is 100 g/m$^2$/24 hr., an oxygen transmission rate (oxide resistance) is 300 cc/m$^2$ /hr./atm, and heat conductivity (heat dissipation) is 6.7×10$^{-4}$ cal/sec.cm ° C. Another usable material may be drawn nylon where water absorptivity (waterproof property) is 10%, water-vapor permeability (dampproofness) is 130 g/m$^2$/24 hr., an oxygen transmission rate (oxide resistance) is 2 cc/m$^2$ /hr./atm, and heat conductivity (heat dissipation) is 6.7×10$^{-4}$ cal/sec.cm ° C. Another usable material may be PE where water absorptivity (waterproof property) is 0.02%, water-vapor permeability (dampproofness) is 20 g/m$^2$/24 hr., an oxygen transmission rate (oxide resistance) is 250 cc/l$^2$ /hr./atm, and heat conductivity (heat dissipation) is 6.7×10$^{-4}$ cal/sec.cm ° C. Another usable material may be drawn polypropylene (PP) where water absorptivity (waterproof property) is 0.01%, water-vapor permeability (dampproofness) is 8 g/m$^2$/24 hr., an oxygen transmission rate (oxide resistance) is 100 cc/m$^2$ /hr./atm, and heat conductivity (heat dissipation) is 6.7 10$^{-4}$ cal/sec.cm ° C. In addition, heat-shrinkable type polyethylene terephthalate (PET) is also usable.

The method of manufacturing an article with an electronic circuit and the same manufactured by the method according to the embodiments of the present invention are applicable to, for example, circuit boards for use in base stations for telecommunication, air conditioners, washing machines, gas meters, various outdoor devices, and various AV (audio visual) apparatuses usable outdoors.

It should be understood that the present invention is not limited to the embodiments disclosed, but is capable of numerous other modifications.

One example is to place a sheet, composed of a shielding material such as copper and aluminum for preventing electromagnetic waves, on top of a board with components mounted thereon and then to package the board with the film. In this case, in addition to the above-disclosed functions and effects, an electromagnetic shielding effect can be implemented. As the shielding material, a shielding material in which an OH base of nylon is replaced with Ag is also usable.

Further, composing the above films 3, 3A, 3B, and 3D with transparent or translucent visible materials makes the board 1 and the electronic components 2, . . . , 2 and 2A mounted on the board 1 visible, which facilitates maintenance, repair, and recycling operations. In the case of the board 1 having an LED and the like in particular, use of the transparent films 3, 3A, 3B, and 3D are preferable for increasing visibility of the LED and the like.

Figure 19:
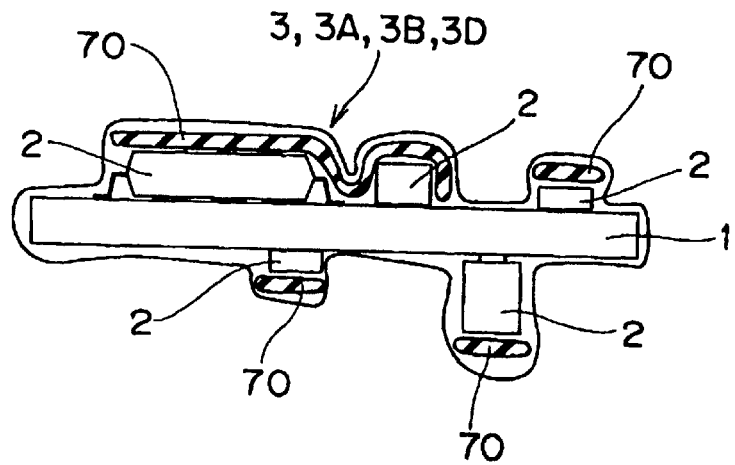
FIG. 19 is a schematic explanatory view showing an article with an electronic circuit having an elastic sheet according to another embodiment of the present invention, in which space is provided between the elastic sheet and a film and between the elastic sheet and a board and components for easier understanding, though close contacts therebetween are preferable in practice.

In addition, as shown in FIG. 19, an elastic sheet 70 is provided between the films 3, 3A, 3B, and 3D and the components 2, . . . , 2, and 2A, or the board 1, so that a shock absorbing function can be imparted to the article with an electronic circuit, resulting in further improvement of impact resistance of the board 1, components 2, . . . , 2, and 2A. In this case, an elastic sheet is preparatorily attached to or integrated into the surface of the film confronting the components 2, . . . 2, and 2A or the board, which implement film, resulting in increased productivity.

Figure 20:
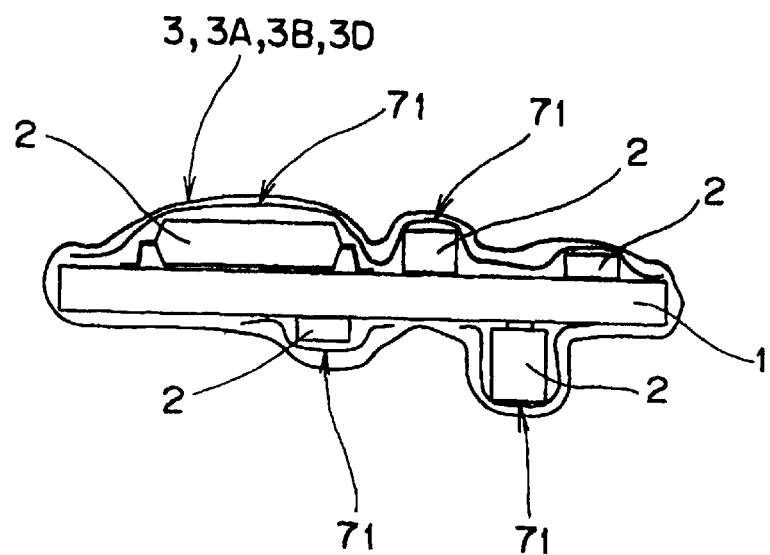
FIG. 20 is a schematic explanatory view showing an article with an electronic circuit having an adhesion layer according to another embodiment of the present invention, in which space is provided between the adhesion layer and a film and between the adhesion layer and a board and components for easier understanding, though close contacts therebetween are preferable in practice.

Further, as shown in FIG. 20, an adhesion layer 71 is provided in the inner surface of the films 3, 3A, 3B, and 3D for adhering the films 3, 3A, 3B, and 3D to the components 2, 2, and 2A, or the board 1. This makes it possible to prevent the films 3, 3A, 3B, and 3D from being removed from the electronic components 2, . . . , 2, 2A, or the board 1 even when the degree of vacuum in the films 3, 3A, 3B, and 3D is degraded by air and the like entering inside the films 3, 3A, 3B, and 3D. As a result, the films 3, 3A, 3B, and 3D are capable of maintaining the protection of the board 1 and the components 2, . . . , 2, and 2A. The adhesion layer 71 may be obtained by applying adhesives like dots, a sheet, or stripes.

Figure 21:
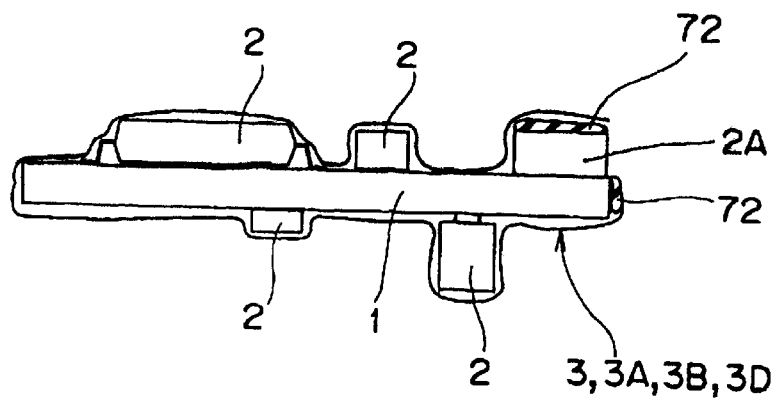
FIG. 21 is a schematic explanatory view showing an article with an electronic circuit having an adhesion layer in a connection portion according to another embodiment of the present invention, in which space is provided between the adhesion layer and a film and between the adhesion layer and a board and components for easier understanding, though close contacts therebetween are preferable in practice.

As shown in FIG. 21, in the vicinity of a connecting section (the vicinity of components connecting to the outside) on the board 1 including the vicinity of a connector 2A, the vicinity of an external output terminal such as earphone jacks, the vicinity of an input terminal, the vicinity of a power terminal, and the vicinity of a battery holder, the films 3, 3A, 3B, and 3D are brought into close contact with the connecting section through use of an adhesive 72 such as sealing agents. This makes it possible to prevent damage on a sealed state of the films 3, 3A, 3B, and 3D at the vicinity of the connecting section.

Further, it is also possible to provide the films 3, 3A, 3B, and 3D with an ability to allow gases generated from flame retarders and solder flux used in the board 1 or the components 2, . . . , 2, or 2A, and moisture generated from the board 1 made of paper phenol to pass from inside to outside but to prevent moisture and dust from invading to the inside of the films 3, 3A, 3B, and 3D from the outside. Consequently, the films 3, 3A, 3B, and 3D covering the board 1 can be protected for a long period of time from being expanded by gases or moisture generated from the board 1, components 2, . . . , 2, or solder flux, and thereby protected from suffering a deteriorated degree of vacuum, or breakage. Materials having such function include PTFE (polytetrafluoroethylene) (product name: GORE-TEX®).

It is also possible that the edges of the films 3, 3A, 3B, and 3D are welded to package the board 1 in a sealed condition. The board 1 is then unsealed through cutting of the welded portions at the edges of the films 3, 3A, 3B, and 3D for required operations, such as adjustment of connection to external circuits or the components 2, . . . , 2, or 2A after which the edges of the films 3, 3A, 3B, and 3D are attached again to each other with use of a sealing material to be sealed again.

Figure 22:
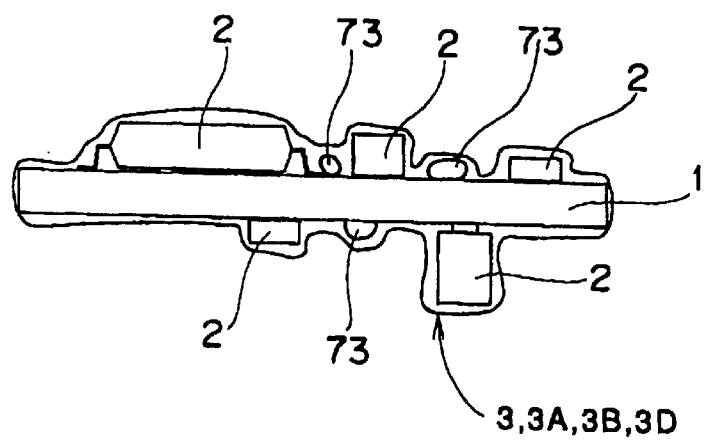
FIG. 22 is a schematic explanatory view showing an article with an electronic circuit having an absorbent according to another embodiment of the present invention, in which space is provided between the absorbent and a film and between the absorbent and a board and components for easier understanding, though close contacts therebetween are preferable in practice.

It is also possible as shown in FIG. 22 to provide inside the films 3, 3A, 3B, and 3D an absorbent 73 such as desiccants and activated carbon for absorbing gases generated from flame retarders and solder flux used in the board 1, the components 2, . . . , 2, or 2A as well as moisture generated from the board 1 made of paper phenol. Consequently, the films 3, 3A, 3B, and 3D covering the board 1 can be protected for a long period of time from being expanded by gases or moisture generated from the board 1, components 2, . . . , 2, or 2A or solder flux, and thereby be protected from suffering a deteriorated degree of vacuum, or breakage.

Further, it is possible that the board 1 is heated in advance to a temperature equal to or higher than the temperature at which the films 3, 3A, 3B, and 3D are softened, and lower than the temperature at which the films 3, 3A, 3B, and 3D are melted, and within a range that a bonding agent to bind the board 1 and the components 2, . . . , 2, and 2A is not melted (e.g. 100 to 130° C.). After that, the board 1 is packaged with the films 3, 3A, 3B, and 3D. Consequently, the films 3, 3A, 3B, and 3D are softened upon contact with the heated board 1, which allows the films 3, 3A, 3B, and 3D to easily conform to the board 1 and the components 2, . . . , 2 and 2A. Materials having such function include PET, ABS, and PEN (polyethylene naphthalate).

It should be understood that among the above-described various embodiments, some embodiments may be appropriately combined to implement various effects peculiar to each embodiment.

Hereinbelow, a detailed description will be given of the method of manufacturing the article with an electronic circuit formed according to the above-disclosed embodiments with reference to examples of the above-disclosed embodiments of the present invention and comparative examples thereof Circuit Boards On electrodes of a glass epoxy board (dimensions: 95 mm×140 mm×0.8 mm), a conductive adhesive (contents: silver-filled epoxy resin system) was printed, and a chip capacitor component (dimensions: 1.0 mm×0.5 mm×0.5 mm) was mounted on the above specified position with use of an electronic component mounting apparatus (unshown). The board was then passed through a reflow furnace so that the conductive adhesive was heat-hardened, by which electrical bonding between the board electrodes and the component electrodes was completed.

Next, the circuit board obtained by the above process was subjected to processing as shown below to produce samples. The samples were produced with materials and conditions shown below:

Film Materials

Film A: nylon 6 (thermoplastic resin made by Toray Industries, Inc.) Film B: ABS (thermoplastic resin made by Taihei Chemicals Limited) Film C: PET (thermoplastic resin made by Teijin Chemicals Ltd.) Film D: silicone rubber (made by Toray Industries, Inc., Dow Corning Corp.) Film E: polycarbonate (thermoplastic resin made by Tsutsunaka Plastic Industry Co., Ltd.)

Film States

A packaging state "b" represents packaging with a cylindrical film, whereas a packaging state "c" represents packaging with two sheet-like films.

The samples (working examples 1 to 5) were manufactured under the conditions shown in Table 1 below.

EXAMPLE 1 to 5

TABLE 1

| Working example | 1 | 2 | 3 | 4 | 5 |
|---|---|---|---|---|---|
| Board Packaged by | Film | Film | Film | Film | Film |
| Film Thickness (mm) | 125 | 100 | 100 | 100 | 100 |
| Film Material | A | B | B | C | C |
| Film State | b | b | b | b | b |
| Internal Pressure When Depressed (Torr) | 100 | 150 | 10 | (Heat shrunken) | (Heat shrunken) |

The samples (comparative examples 1 to 8) were manufactured under the conditions shown in Table 2 below.

TABLE 2

| Comparative Example | 1 | 2 | 3 | 4 | 5 | 6 | 7 | 8 |
|---|---|---|---|---|---|---|---|---|
| Board Packaged by | Urethane sealing | Film | Film | Film | Film | Film | Film | Film |

TABLE 2-continued

| Comparative Example | 1 | 2 | 3 | 4 | 5 | 6 | 7 | 8 |
|---|---|---|---|---|---|---|---|---|
| Film Thickness (mm) | — | 8 | 300 | 100 | 100 | 100 | 100 | 100 |
| Film Material | — | B | B | D | B | B | E | C |
| Film State | — | b | b | b | c | b | b | c |
| Internal Pressure When Depressed (Torr) | — | 100 | 100 | Depression unavailable | Depression unavailable | 300 | (Heated) | (Heated) |

Various properties of the samples obtained through the above processes were measured. The measurement was made as follows:

1) Impact resistance: samples were dropped from a 1m-high position, and it was observed if any component was missed or not. The samples without chipping were determined to be good, whereas those with chipping were determined to be NG.

2) Packaging (sealing) time: the period of time taken for a packaging or sealing process in manufacturing the samples was measured.

3) Component recovery: unpacking of the samples was conducted for the purpose of determining if the components could be removed from the board. The samples that could be unpacked without damaging the components were determined to be good, where those with damage to the components were determined to be NG.

4) Water absorption: weight ($w_0$) of the samples were measured, and then the samples were left in a 60° C. 90% RH constant-temperature high-humidity bath for 1000 hours. After the samples were extracted from the bath, the weight ($w_1$) thereof was measured again. The water absorption was obtained with $\{(w_1-w_0)/w_0\} \times 100$ = water absorption (%).

The result of the property measurement of each sample is shown in Table 3.

TABLE 3

| | Impact Resistance | Packaging (Sealing) Time | Component Recovery | Water Absorption |
|---|---|---|---|---|
| Working Example 1 | Good | 1 min. | Good | 0.45 |
| Working Example 2 | Good | 0.8 min. | Good | 0.51 |
| Working Example 3 | Good | 1.5 min. | Good | 0.29 |
| Working Example 4 | Good | 0.8 min | Good | 0.44 |
| Working Example 5 | Good | 0.8 min | Good | 0.39 |
| Comparative Example 1 | NG | 8 hr. | NG | 0.30 |
| Comparative Example 2 | NG | 1 min. | Good | 0.45 |
| Comparative Example 3 | Good | 1 min. | Good | 1.10 |
| Comparative Example 4 | Good | packaging unavailable | — | — |
| Comparative Example 5 | NG | packaging unavailable | — | — |
| Comparative Example 6 | Good | 0.6 min. | Good | 1.11 |
| Comparative Example 7 | NG | packaging unavailable | — | — |
| Comparative Example 8 | NG | packaging unavailable | — | — |

Table 3 indicates that the articles with an electronic circuit manufactured according to the working examples corresponding to the embodiments of the present invention enables packaging in a short period of time, has excellent impact resistance, enables stable recovery of components, and has excellent water absorption.

Conventionally, in packaging boards with components mounted thereon by inserting them into a bag, if the size of the boards and the components varies, different sized bags should be prepared in advance and an appropriately sized bag should be selected according to each size of the boards and components.

Contrary to this, the present invention makes it possible to cover an article with a circuit (e.g. a board) with sheet-like films or a cylindrical film, which enables use of the same sheet-like films or the cylindrical film for packaging various products in which the size of the board and the components varies. As a result, generality is achieved and a packaging operation is simplified and facilitated. For example, in the case where a rectangular cylindrical film is used to package a rectangular board, the board is inserted into the cylindrical film so that a lengthwise direction of the board aligns with a lengthwise direction of the cylindrical film since the boards normally tend to vary in size in their lengthwise directions. Accordingly, the cylindrical film becomes capable of corresponding to different sized boards only by changing the sealing position of the cylindrical film in the lengthwise direction. In addition, in the case where rectangular boards vary in size not only in lengthwise direction but also in short side direction orthogonal to the lengthwise direction, a rectangular board is covered with one rectangular sheet-like film and then the film is fixed to the board, or both front and back surfaces of the rectangular board are covered with two rectangular sheet-like film(s) and then the sheet-like films are fixed to each other. Accordingly, a simple operation of changing the fixing position of the sheet-like films makes it possible to correspond to different sized boards.

As a result, the present invention is capable of corresponding to different sized boards 1, achieving generality, being packaged in a short period of time, increasing impact resistance, and facilitating recovery and recycling of components 2, . . . , 2 and 2A, the board 1, and the like. In addition, the board and the components covered by the film ensure protection of circuits, prevent dew formation, prevent dirt and dust from being mixed or accumulated inside the package, prevent insects such as cockroaches and ants from invading (prevention of corrosion due to formic acid), and prevent Further, composing the above films with transparent or translucent visible materials allows the board and the electronic components mounted on the board to be made visible, which facilitates maintenance, repair, and recycling operations.

In addition, an elastic sheet is provided in between the films and the components or the board, so that the elastic sheet has a shock absorbing function which can be imparted to the article with an electronic circuit. This arrangement results in further improvement regarding impact resistance of the board and the components.

In addition, an adhesion layer is provided in the inner surface of the films for adhering the films to the components or the board. This makes it possible to prevent the films from being removed from the electronic components or the board even when the degree of vacuum in the films is degraded by air and the like entering inside thereof As a result, the films become capable of maintaining a function of protecting the board and the components.

Further, in the vicinity of a connecting section on the board including the vicinity of a connector, the vicinity of an external output terminal such as earphone jacks, the vicinity of an input terminal, the vicinity of a power terminal, and the vicinity of a battery holder, the films are brought into close contact with the connecting section through the use of adhesives. This makes it possible to prevent damage in a sealed state of the films.

Further, it is also possible for the films to allow gases generated from flame retarders and solder flux used in the board and the components, as well as moisture generated from the board made of paper phenol etc., to pass from inside to outside while still preventing moisture and dust from invading the inside of the films from the outside. Consequently, the films covering the board can be protected for a long period of time by preventing expansion by gases or moisture generated from the board, the components, or solder flux, and thereby protect the package from suffering a deteriorated degree of vacuum or breakage.

It is also possible that the films are welded to package the board in a sealed condition, and then the board is unsealed by cutting the welded portions of the films to accomplish operations such as connection to external circuits or adjustment of the components. After being unsealed the films are attached again to each other with use of a sealing material so as to be sealed again.

It is also possible to provide an absorbent, such as desiccants and activated carbon, inside the film for absorbing gases generated from flame retarders and solder flux used in the board and the components as well as moisture generated from the board made of paper phenol, etc. Consequetly, the films covering the board can be protected for a long period of time an prevented from being expanded by gases or moisture generated from the board, the components, or solder flux. Thereby the package is protected from suffering a deteriorated degree of vacuum, or breakage.

Further, it is possible that the board 1 is previously heated to a temperature equal to or higher than the temperature at which the cylindrical film or sheet-like films are softened, and lower then the temperature at which the cylindrical film or sheet-like films are melted, and to a temperature within a range that a bonding agent to bind the board and the components is not melted. After that, the board 1 is packaged with the cylindrical film or sheet-like films. Consequently, the cylindrical film or sheet-like films are softened upon contact with the heated board, which allows the cylindrical film or sheet-like films to easily confrom to the contour of the board.

Although the present invention has been fully described in connection with the preferred embodiments thereof with reference to the accompanying drawings, it is to be noted that Various changes and modifications are apparent to those skilled in the art. Such changes and modification are to be understood as included within the scope of the present invention as defined by the appended claims unless they depart therefrom.

What is claimed is:

1. An electronic circuit-formed article manufacturing method, comprising:

inserting a circuit board having electronic components into a cylindrical film so that the circuit board is covered with the cylindrical film;

after the circuit board has been inserted into the cylindrical film, sealing openings of the cylindrical film so as to package the circuit board; and conducting decompression between the film and the circuit board so that the film conforms to the contour of the circuit board when covering the circuit board with the film, said conducting decompression being conducted between the film and the circuit board by using a hole in one of the components so that the film conforms to the contour of the circuit board, and by using a valve arranged in the hole to prevent gas from entering between the film and the circuit board through the air hole from outside.

2. The manufacturing method of claim 1, wherein the film is formed of a thermoplastic material, further comprising heating the film simultaneously with said conducting decompression so as to achieve sealing.

3. The manufacturing method of claim 2, wherein said conducting decompression comprises maintaining an internal pressure of the film at no greater than 200 Torr.

4. The manufacturing method of claim 1, wherein said conducting decompression comprises maintaining an internal pressure of the film at no greater than 200 Torr.

5. An electronic circuit-formed article manufacturing method, comprising:

inserting a circuit board having electronic components into a cylindrical film so that the circuit board is covered with the cylindrical film;

arranging an elastic sheet between the cylindrical film and the circuit board; and after the circuit board has been inserted into the cylindrical film and the elastic sheet has been arranged between the cylindrical film and the circuit board, sealing openings of the cylindrical film so as to package the circuit board.

6. An electronic circuit-formed article manufacturing method, comprising:

inserting a circuit board having electronic components into a cylindrical film so that the circuit board is covered with the cylindrical film;

forming an adhesion layer on an internal surface of the cylindrical film to adhere the cylindrical film to the circuit board; and after the circuit board has been inserted into the cylindrical film and the adhesion layer has been formed on the cylindrical film, sealing openings of the cylindrical film so as to package the circuit board.

7. The manufacturing method of claim 6, wherein said forming of the adhesion layer comprises applying at least one of adhesive dots, adhesive sheet, and adhesive stripes to the cylindrical film.

8. An electronic circuit-formed article manufacturing method, comprising:

inserting a circuit board formed of paper phenol and having electronic components into a cylindrical film so that the circuit board is covered with the cylindrical film, the cylindrical film being operable to allow gas generated from flame retarders and solder flux, and moisture at the circuit board, to pass from inside the film to outside the film while preventing moisture and dust from entering inside the film from the outside; and after the circuit board has been inserted into the cylindrical film, sealing openings of the cylindrical film so as to package the circuit board.

9. An electronic circuit-formed article manufacturing method, comprising:

inserting a circuit board formed of paper phenol and having electronic components into a cylindrical film so that the circuit board is covered with the cylindrical film;

providing an absorbent inside the cylindrical film for absorbing gas generated from flame retarders and solder flux, and for absorbing moisture generated at the circuit board; and after the circuit board has been inserted into the cylindrical film and the absorbent has been provided between the cylindrical film and the circuit board, sealing openings of the cylindrical film so as to package the circuit board.

10. The manufacturing method of claim 9, wherein the absorbent comprises at least one of desiccants and activated carbon.

11. An electronic circuit-formed article manufacturing method, comprising:

heating a circuit board to a temperature equal to or greater than a temperature at which a cylindrical film is softened, lower than a temperature at which the cylindrical film is melted, and lower than a temperature at which a bonding agent to bond the circuit board having electronic components is melted;

inserting the heated circuit board into the cylindrical film so that the circuit board is covered with the cylindrical film; and after the circuit board has been heated and then inserted into the cylindrical film, sealing openings of the cylindrical film so as to package the circuit board, whereby the cylindrical film is softened upon contact with the heated circuit board so that the cylindrical film conforms to a contour of the circuit board.

* * * * *